(12) United States Patent
Shiwaku et al.

(10) Patent No.: US 6,374,748 B1
(45) Date of Patent: Apr. 23, 2002

(54) TRACKING CART SYSTEM

(75) Inventors: Tamotsu Shiwaku, Kani; Isamu Matsui, Kyoto; Takashi Nakao, Neyagawa, all of (JP)

(73) Assignee: Murata Kikai Kabushiki Kaisha, Kyoto (JP)

( * ) Notice: Subject to any disclaimer, the term of this patent is extended or adjusted under 35 U.S.C. 154(b) by 0 days.

(21) Appl. No.: 09/696,239

(22) Filed: Oct. 26, 2000

(30) Foreign Application Priority Data

Oct. 28, 1999 (JP) .......................................... 11-306357
Apr. 19, 2000 (JP) ....................................... 2000-117417

(51) Int. Cl.⁷ ............................................. B61B 13/00
(52) U.S. Cl. ..................... 104/243; 104/245; 191/29 R; 191/32; 191/23 R
(58) Field of Search ................................. 191/10, 29 R, 191/32, 23 R; 104/287, 292, 295, 296, 303, 242, 243, 245, 88.03, 88.01, 88.02; 238/10 R, 10 A; 246/122 R, 122 A, 124

(56) References Cited

U.S. PATENT DOCUMENTS 5,551,350 A * 9/1996 Yamada et al. ............. 104/290
5,709,291 A * 1/1998 Nishino et al. ............... 191/10
6,109,568 A * 8/2000 Gilbert et al. ........... 104/88.03

* cited by examiner

*Primary Examiner*—Mark T. Le
(74) *Attorney, Agent, or Firm*—Armstrong, Westerman & Hattori, LLP (57) ABSTRACT

A guide rail 2 having cables for non-contact power feeding is laid on a floor 22 in a clean room, and the guide rail 2 serves to guide each of guide rollers 60 of a tracking cart 4, and the cable serves to feed electrical power to a pickup coil of a tracking cart 4. This construction gives a tracking cart system that is easy to construct and easy to alter a layout thereof and is structurally compact and intrinsically clean.

8 Claims, 9 Drawing Sheets

TRACKING CART SYSTEM

FIELD OF THE INVENTION

The present invention relates to a tracking cart system using a non-contact power feeding.

BACKGROUND OF THE INVENTION

In many of the conventional tracking cart systems, a rail is laid under a floor and a tracking cart is made to travel along the rail. This is because arrangement of the rail under the floor prevents dust generated by the rail part from contaminating a space above the floor and also because the rail is intended not to hamper the crew's walking etc.

However, if the rail needs to be laid under the floor, the tracking cart system cannot be introduced unless its construction is considered in a design stage of a building and it is also difficult to alter a layout thereof. Moreover, in laying the rail, there may arise a problem of struggling of the rail against building structures, such as columns, beams, pipe arrangement, etc., for exclusive possession of a space.

There is an additional problem if the above-mentioned tracking cart system is such a system that a pair of power feeding wires are arranged along the guide rail and a high frequency current is made to flow through the wires to effect non-contact power feeding of electrical power to a pickup coil of the tracking cart, conventionally power feeding wire holders are set on the guide rail with a spacing therebetween to hold the power feeding wires, but this system causes a problem that the power feeding wires are exposed. Because of exposure of the power feeding wires, the conventional guide rail lacks a good appearance, and in the case where the guide rail is laid on the floor, the crew is likely to get held up by the power feeding wires. Further, because a number of holders are to be used, easiness of the construction is low.

It is a primary task of the present invention to provide a compact tracking cart system where the laying of the guide rail and the alteration of the layout are made to be easy and at the same time raising dust is prevented.

It is an additional task of the present invention to provide a more compact system where the guide rail is also used to put thereon marks that are to be read by a sensor or sensors in the tracking cart.

It is an additional task of the present invention to provide the guide rail equipped with the power feeding wires for non-contact power feeding which is easy to manufacture.

It is an additional task of the present invention to provide a more compact system where the power feeding wire holder is also used to put thereon marks serving as signals for the tracking cart.

It is an additional task of the present invention to provide a system where the guide rail can be installed easily on the floor of a clean room and so on.

It is an additional task of the present invention to provide a combination of the guide rail for non-contact power feeding and the power feeding wire holder both of which are easy to construct and which can realize high-accuracy positioning of the pickup coil and high reliability.

It is an additional task of the present invention to increase power feeding efficiency of the power feeding wires for feeding electrical power to the pickup coil.

It is an additional task of the present invention to provide a tracking cart system where the guide rail and the power feeding wire holder can be installed simultaneously and the positioning between the guide rail and the power feeding wire holder can be made easier.

It is an additional task of the present invention to provide a system where the guide rail and the power feeding wire holder can be installed on the floor of the clean room and so on easily.

SUMMARY OF THE INVENTION

The present invention provides a tracking cart system comprising a guide rail equipped with power feeding wires for non-contact power feeding that is laid on the floor, and a tracking cart equipped with guide rollers which are guided by the guide rail and a pickup coil for being fed electrical power by the power feeding wires.

Preferably, the guide rail is provided with marks and the tracking cart is provided with a sensor or sensors for detecting the marks.

Further, preferably, the power feeding wire holder is fixed on the guide rail along its longitudinal direction and the power feeding wires are held by this power feeding wire holder.

Moreover, preferably, the power feeding wire holder is provided with marks and the tracking cart is provided with a sensor or sensors for detecting the marks.

Furthermore, preferably, the floor is constructed as a grating floor, an attachment member is fixed to the floor with the use of holes of the floor, and then the guide rail is fixed to the attachment member.

The present invention provides a tracking cart system comprising: a guide rail, a power feeding wire holder of a contiguous shape that is provided along the longitudinal direction of the guide rail as a separate body from the guide rail, wherein these two members are positioned to each other, a pair of contiguous grooves in parallel to the guide rail are formed on the power tracking wire holder, a pair of power feeding wires are held by the pair of grooves, and a pickup coil of the tracking cart is positioned to the pair of the power feeding wires by positioning guide rollers of the tracking cart to the guide rail.

Preferably, the contiguous grooves are formed at vicinities of both ends of an almost U-shaped cross section of the power feeding wire holder, the power feeding wires are held in the contiguous grooves, and the pickup coil is positioned in a hollow part of the U-shape.

Moreover, preferably, the power feeding wire holder and the guide rail are both fixed to the attachment member on the floor by means of a common fastening member.

Furthermore, preferably, the attachment member is fixed to the floor with the use of holes formed on the grating floor.

According to a first aspect of the present invention, since the guide rail is laid on the floor in the clean room and so on, unlike a case where the guide rail is laid under the floor, the laying of the guide rail and the alteration of the layout thereof are easy to carry out. This is because there doesn't occur the struggling of the guide rail against columns, beams, pipe arrangement, etc. for exclusive possession of a space under the floor. Further, according to the first aspect of the present invention, the power feeding wires for non-contact power feeding are set on the guide rail and serves to feed electrical power to the pickup coil of the tracking cart. Because of this power feeding system, there doesn't occur raising dust due to contacting of relevant members at a power feeding part, so that the tracking cart system hardly contaminates the clean room and so on. Furthermore, since the power feeding wires can be integrated with the guide rail, the power feeding wires and the guide rail are made to be more compact and their laying also becomes easy.

According to the present invention, since the guide rail is provided with marks that are to be detected by the sensors of the tracking cart, control of the tracking cart becomes easy and the power feeding wires and the guide rail are made to be much more compact because the marks are integrated with the guide rail.

According to the present invention, a power feeding wire holder that requires complicated molding is preferably fixed to a guide rail made of a hard material whereof a precise element can be manufactured easily, such as aluminum, a nylon, an engineering plastic and so on. Therefore, comparing to the guide rail integrated with the power feeding wire holder in one body, this construction facilitates their manufacturing.

According to the present invention, since the power feeding wire holder is provided with marks that are to be detected by the sensors of the tracking cart, the control of the tracking cart becomes easy and the power feeding wires and the guide rail are made to be much more compact because the marks are integrated with the power feeding wires.

According to the present invention, the attachment members are preferably fixed on the grating floor in the clean room with the use of holes of the grating. Then the guide rail is preferably fixed to this attachment members. Therefore, the fixing of the guide rail becomes easier compared to the case where the guide rail is installed on the grating floor directly.

According to the present invention, the guide rail made of a hard material whereof a precise element can be manufactured easily, such as aluminum, a nylon, an engineering plastic, etc. and the power feeding wire holder of a contiguous shape that is to be installed along the longitudinal direction of this guide rail are provided in separate bodies and both the members are positioned to each other by means of pins, keys and so on. Since the power feeding wire holder is required to have a more complicated shape than the guide rail, the power feeding wire holder in a separate body that is different from the guide rail facilitates the manufacturing thereof. A pair of contiguous grooves are formed on the power feeding wire holder in parallel to the guide rail, on which the pair of power feeding wires are held, and this power feeding wires serves to feed electrical power to the pickup coil of the tracking cart in a non-contact manner. Here, if the guide rollers of the tracking cart are positioned by the guide rail, since the power feeding wire holder has already been positioned, the pickup coil of the tracking cart is concomitantly positioned to the power feeding wires.

According to the present invention, since the power feeding wire holder is in a contiguous shape along the longitudinal direction of the guide rail, the construction of the power feeding wires becomes easy. Further, since the power feeding wires are housed in the contiguous grooves of the power feeding wire holder, the crew is not liable to get held up by the power feeding wires, therefore the reliability is improved, and the good appearance of the power feeding wire holder is ameliorated. Furthermore, since the power feeding wires are positioned to the guide rail and the tracking cart is also positioned to the guide rail, the pickup coil can be positioned to the power feeding wires.

According to the present invention, the power feeding wire holder is preferably manufactured to be in an almost U-shape in its cross section of the short side and of a material of insulating synthetic resin, and the pair of contiguous grooves may be formed in the both ends of the U-shape as seen in the cross section taken along the short side of the holder, and the pickup coil may be positioned in the hollow part of the U-shape. With this structure, the pickup coil is positioned at a position placing between the pair of power feeding wires, hence achieving a high efficiency of the non-contact power feeding. Moreover, even when the pickup coil is displaced either rightward or leftward with respect to the power feeding wires, since the pickup coil displaces from the vicinity of the central part of the pair of power feeding wires to its right or left, decrease of the efficiency of power feeding is controlled to be a small quantity. For this reason, according to the present invention, electrical power can be efficiently fed to the pickup coil from the power feeding wires.

According to the present invention, the power feeding wire holder and the guide rail are preferably fixed to the attachment member on the floor using a common fastening member. Because of this structure, the positioning accuracy of the power feeding wire holder to the guide rail is improved further.

According to the present invention, the attachment member is preferably fixed to the floor with a fastening cramp with the use of holes formed on the floor. Therefore, this construction doesn't require a work to form fixing holes on the floor, hence mitigating load of the construction personnel, and also can maintain air cleanliness class by preventing dust and particles that may be generated through a process of forming the holes in the clean room.

DETAILED DESCRIPTION OF THE PREFERRED EMBODIMENTS

Figure 1:
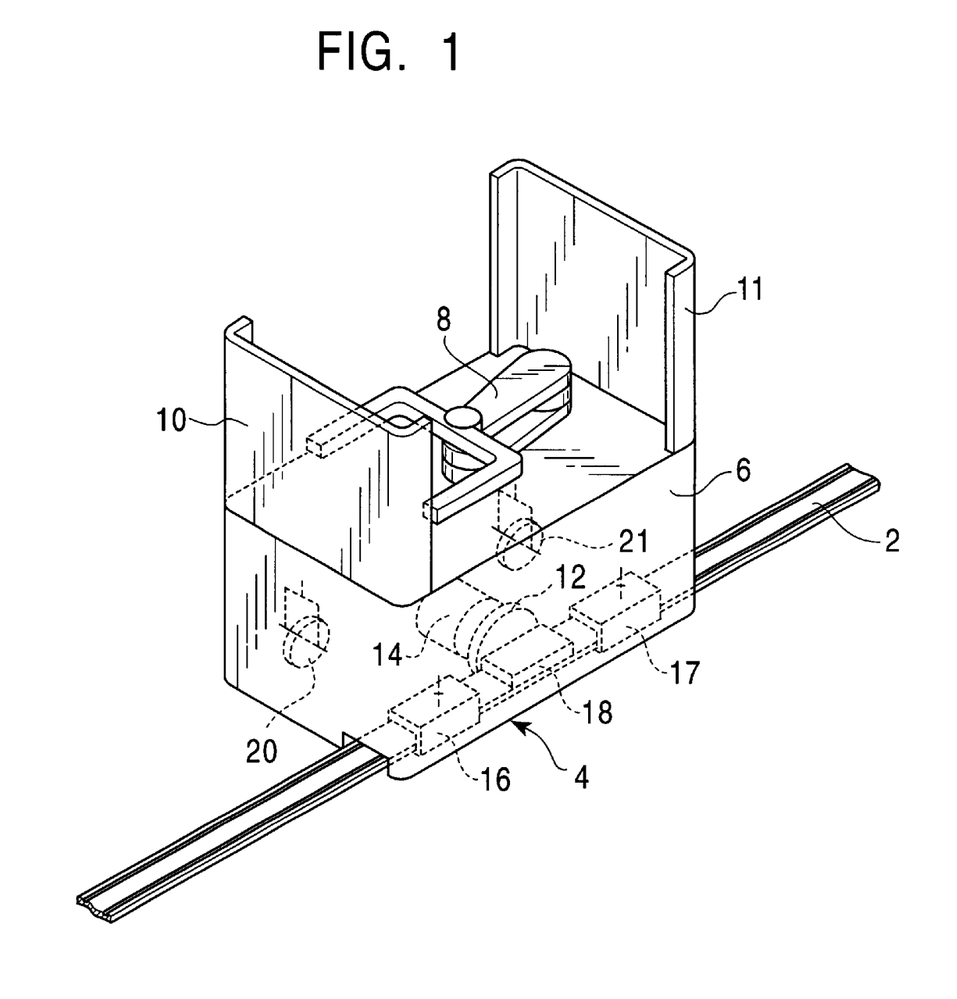
FIG. 1 is a perspective view of a rail and a tracking cart in the embodiment.

FIGS. 1 to 5 show one embodiment of the present invention. FIG. 1 shows schematically a tracking cart 4 on a guide rail 2, wherein the tracking cart 4 is composed of a cart body 6 and loading equipment 8 mounted on the cart body 6. Preferably the loading equipment 8 is made to have, for example, three degrees of freedom, ascent and descent, rotation, and stretching and shrinking (advance from the tracking cart 4 and retreat thereto), so that the loading equipment 8 can load an article in an omnidirectional manner and switch its attitude. 10, 11 are covers, which are for preventing the article from being contacted with wind etc. when the tracking cart 4 is in motion and hence being contaminated.

A driving wheel 12 is provided almost in the central part in the front-rear direction of the cart body 6, rather near to the guide rail 2 in the crosswise direction and travels on the floor. The driving wheel 12 is driven by a drive part 14 equipped with a brake and a motor, and is assembled on the bottom of the cart body 6 with a bearing etc. which are not shown in the drawings. 16, 17 are a pair of guide roller units, each having a plurality of guide rollers, which are provided in the front and in the rear with respect to the driving wheel 12 in terms of the front-rear direction, respectively, and through which the guide roller units 16, 17 are guided by the guide rail 2. By the way, preferably, each of the guide roller units 16, 17 is provided with a mechanism which enables the guide rollers thereof to be guided by the guide rail 2 smoothly when traveling on the curved guide rail 2. 18 is a pickup coil and is for receiving electrical power from the power feeding wires for supplying electrical power in a non-contact manner, such as litz wire set on the guide rail 2 (one pair setting). Moreover, 20, 21 are a pair of driven wheels that are constructed so as to swivel freely in the horizontal plane and are provided in the front and in the rear near a side face of the tracking cart 4 opposite to the guide rail 2. Here, both the driving wheel 12 and the driven wheels 20, 21 are provided, but only the driving wheel 12 may be provided in the tracking cart 4. In such a case, mounting position of the driving wheel 12 is not limited to the position near the guide rail 2 and may be otherwise.

Figure 2:
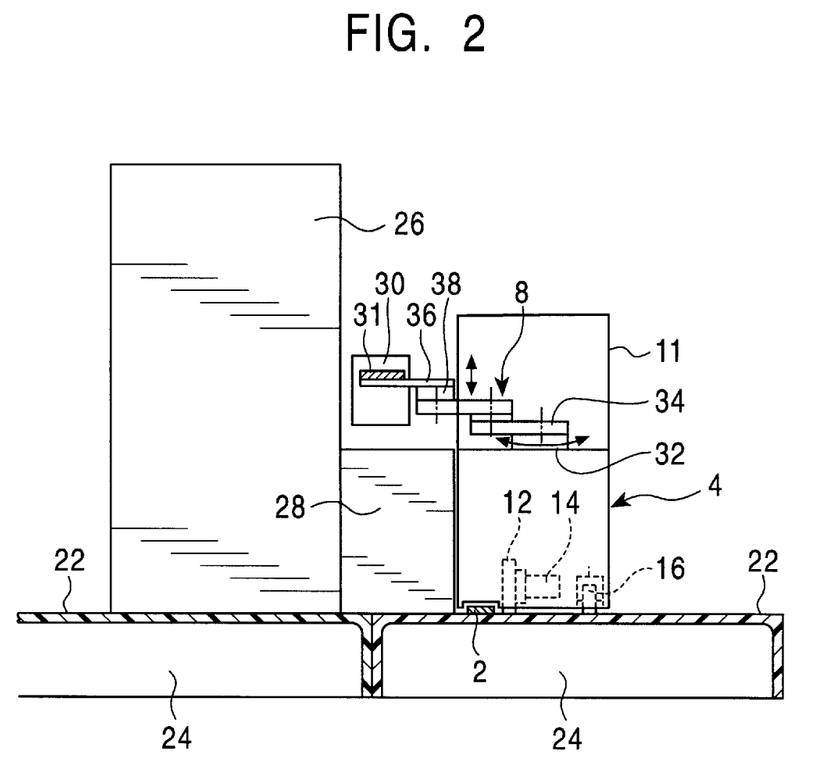
FIG. 2 is a front view showing the tracking cart and the rail in the embodiment with part of an exterior of the tracking cart taken away to show the inside.

FIG. 2 shows a structure of a grating floor 22 and so on wherein 24 is a space under the floor. Conventionally the guide rail 2 has been laid in the space 24 under the floor 24. Contrary to this, in the present invention, the guide rail 2 is literally laid on the grating floor 22. 26 is a processing device such as for semiconductor wafers, liquid crystals, etc., 28 is its load port, and 30 is a cassette to be loaded. The cassette 30 is designed so as to be loaded by the loading equipment 8 that will hold a flange 31 or the like formed on sidewalls of the cassette 30. As shown in FIG. 2, the guide rail 2 is laid so as to make a tour around equipment on the floor, such as the processing device 26, the load port 28, etc. and prevent its interference with the crew and a pushcart.

The loading equipment 8 includes a turn table 32, a scalar arm 34 and a hand 36 all of which enable three kinds of movements, a rotation in the horizontal plane by means of the turn table 32, stretching and shrinking by means of the scalar arm 34, and ascent and descent of the hand 36 done by an elevator part 38. With this mechanical structure, the article situated in one of 360 degrees direction can be loaded to and from the tracking cart 4 and the cassette 30 can be rotated above the upper face of the tracking cart 4, so that an attitude of the cassette 30 is altered or direction thereof is changed and loaded to the load port 28 above the tracking cart 4. The loading equipment 8 is not limited to one that uses the scalar arm 34 but may be one that uses a slide fork, a loading robot, or the like. In any case, it is preferable that the loading equipment 8 has three degrees of freedom, rotation in the horizontal plane, forward and reverse movement (stretching and shrinking), and ascent and descent.

Figure 3:
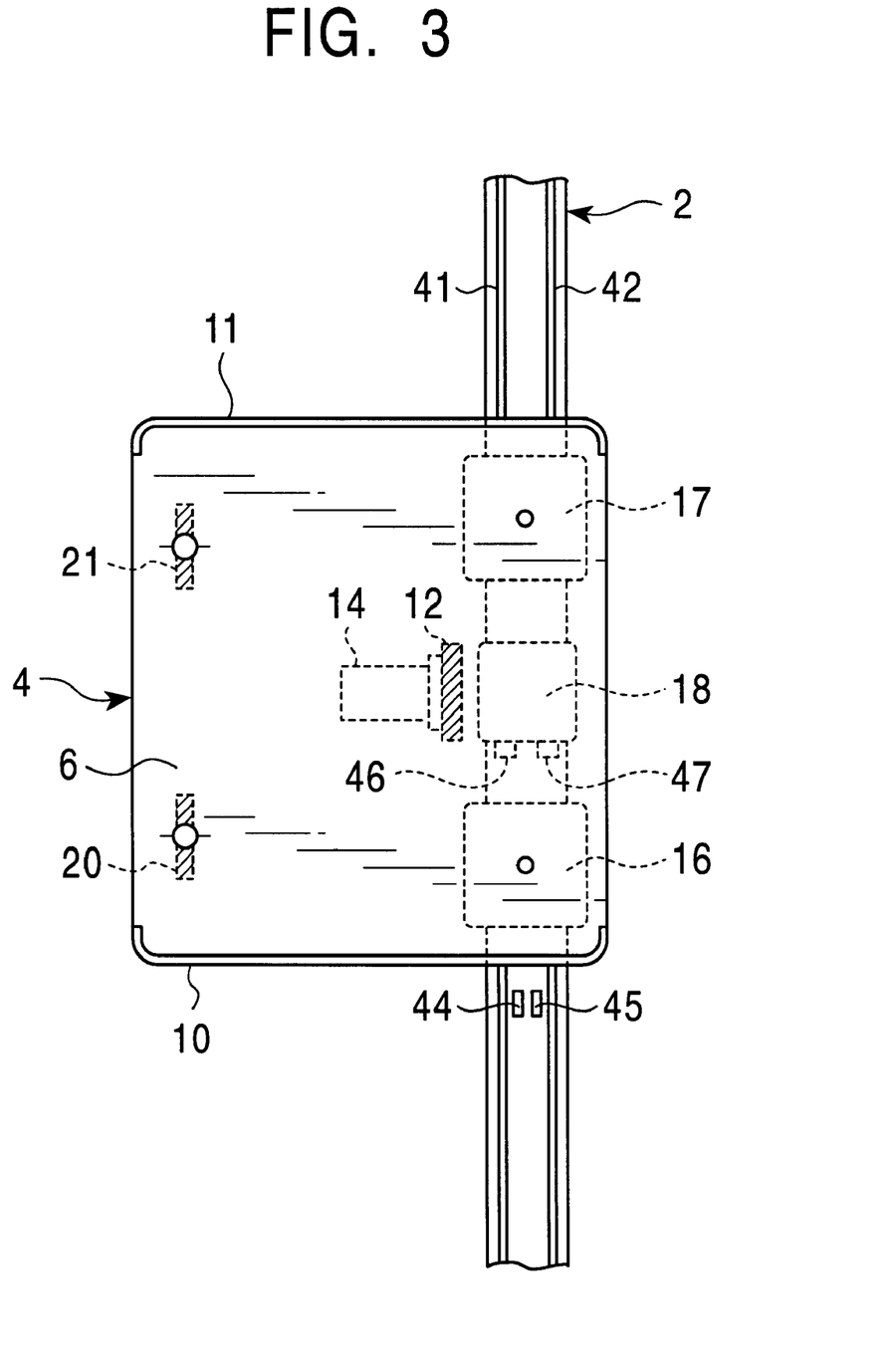
FIG. 3 is a top view of the tracking cart and the rail in the embodiment.

FIG. 3 shows an arrangement of the tracking cart 4 with respect to the guide rail 2. The guide rail 2 is made of a nonmagnetic material, such as a synthetic resin, aluminum, etc., and is positioned to the bottom of the tracking cart 4, near to one sidewall thereof. In recessed parts provided on the surface of the guide rail 2, set are a pair of litz wires 41, 42 that serve as power feeding wires for non-contact power feeding. Moreover, the guide rail 2 is provided with marks 44, 45 etc., which are detected by sensors 46, 47 of the tracking cart 4 to find a position etc. For the marks 44, 45, the tracking cart system may use ones that indicate absolute positions by representing data consisting of a plurality of bits, or alternatively ones such that only their existence is read by the sensors 46, 47 and their positions are recognized by counting the number of the marks from a reference point. Moreover, the sensors 46, 47 are provided, for example, at corresponding positions to the guide rail 2 on the bottom face of the tracking cart 4.

The guide roller units 16, 17 are provided so as to ride on the guide rail 2, for example one unit being in the front and the other being in the rear to make a pair of units, and the pickup coil 18 is provided between the guide roller units 16, 17. Moreover, the tracking cart 4 is made to be able to negotiate curves, for example, by swiveling the guide roller units 16, 17 in the horizontal plane to the cart body 6. The driving wheel 12 is provided in a position between the positions of the guide roller units 16, 17 in the longitudinal direction of the guide rail 2 inside the tracking cart 4 at the same time slightly away from the guide rail 2. The driving wheel 12 is assembled on the tracking cart 4 with a direction of an axle thereof fixed, but the axle may be either pivotally free or fixed. Further, the driven wheels 20, 21 are provided in such a way that the directions of the axles thereof are pivotable, and specifically, for example, a pair of the driven wheels 20, 21 are arranged on the bottom face of the tracking cart 4 near to a sidewall opposite to the guide rail 2, one wheel being at the front and the other wheel being at the rear.

Figure 4:
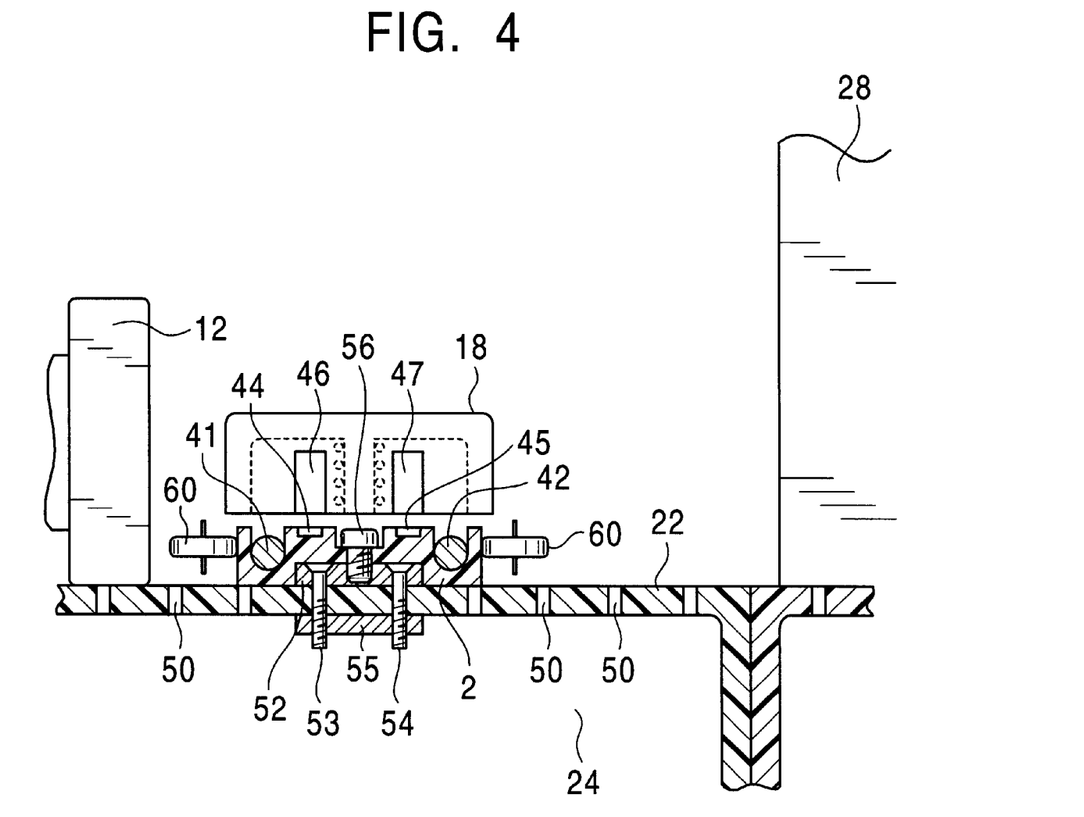
FIG. 4 is a cross section showing the installation of the rail and a pickup coil in the embodiment.

FIG. 4 shows the installation of the guide rail 2 to the grating floor 22. The grating floor 22 has a number of holes 50, and with the use of those holes 50 an attachment plate 52 is fixed on the grating floor 22 with screws 53, 54, a nut plate 55, etc. By the way, a mere nut or the like may be used instead of the nut plate 55 and the attachment plate 52 may be arranged just below the level of the grating floor 22 and on the under face thereof. The guide rail 2 is fixed to the attachment plate 52 with bolts 56 or the like. The above-mentioned litz wires 41, 42 are arranged in a pair of the recessed parts provided on the guide rail 2 and electrical power is received in a non-contact manner by the pickup coil 18 that is formed by winding a wire for a pickup coil 18 around a magnetic core of an E-shape. Further, guide rollers 60 of each of the guide roller units 16, 17 are provided to the right and left sides of each unit, specifically, for example, two guide rollers 60 for each side as in FIG. 4, so that the guide rollers 60 make contact with the side walls of the guide rail 2 and are guided thereby.

Figure 5:
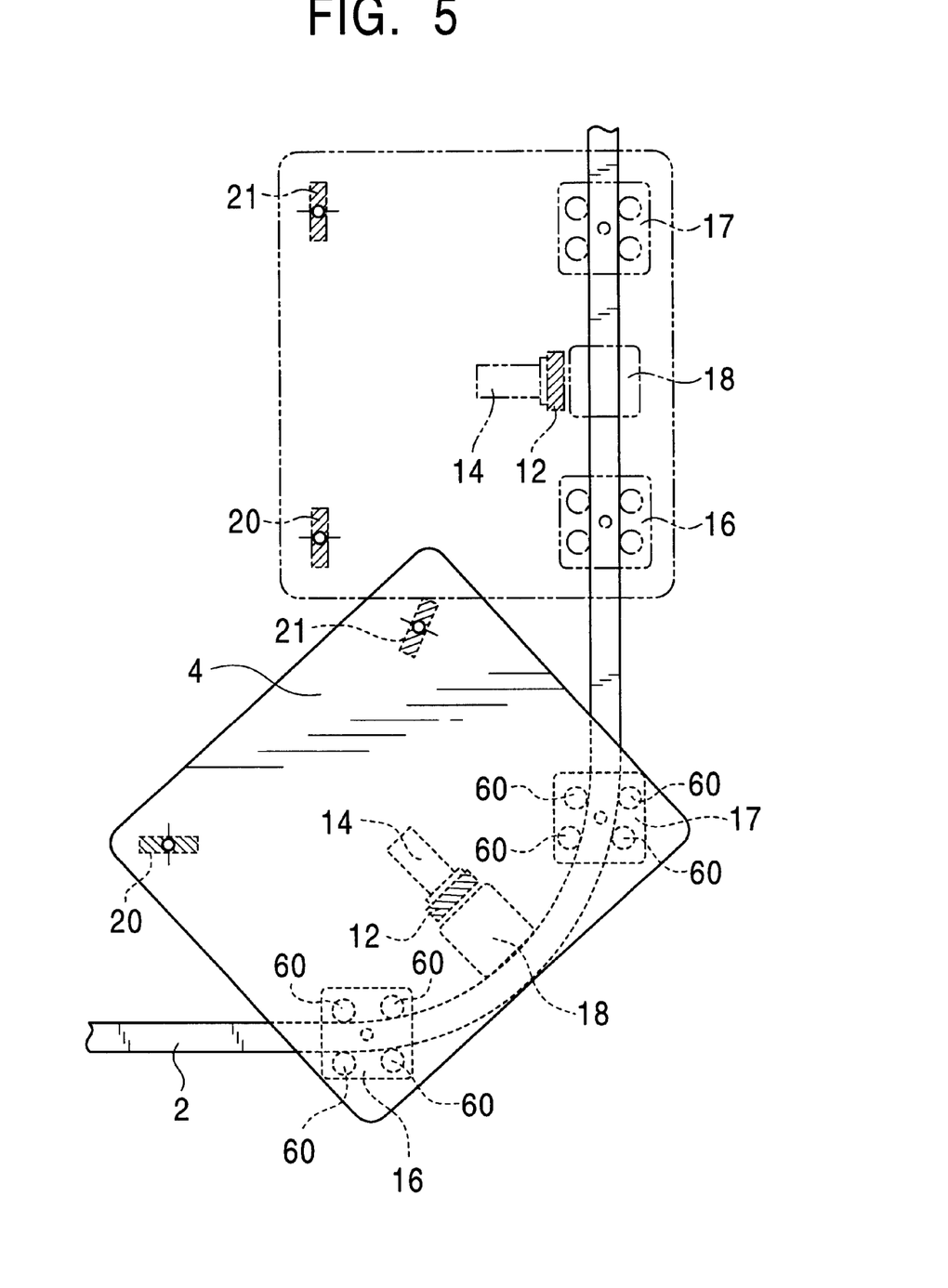
FIG. 5 is a view showing traveling of the tracking cart on a curved rail in the embodiment.

FIG. 5 shows a situation of traveling of the tracking cart 4 on the curved guide rail 2. In straight line sections, the tracking cart 4 is guided by the pair of guide roller units 16, 17 so as to follow the guide rail 2 and fed by the litz wires 41, 42 through the pickup coil 18. Further, the tracking cart 4 recognizes its position etc. by reading the marks 44, 45 with the sensors 46, 47 and controls its travel motion. The driving wheel 12 is situated at an inner position than the guide rail 2, and since the distance from the guide rail 2 is short and also in the vicinity of the center line with respect to the front-rear direction of the tracking cart 4, the driving wheel 12 can travel on the curved guide rail 2 without getting entailed with the guide rail 2 even when the axle direction of the driving wheel 12 is fixed in the horizontal plate. The driven wheels 20, 21 are situated on the bottom face, at the opposite side to the guide rail 2, in such a way that the directions of the axles are pivotally free, so that the driven wheels 20, 21 can negotiate curves similarly.

Moreover, since the guide roller units 16, 17 are linked to the bottom face of the tracking cart 4 through pivotable axes or the like, the guide roller units 16, 17 can change their direction in accordance with a curved guide rail 2 and this change enables the guide roller units 16, 17 to negotiate curves. By the way, if the number of the guide rollers 60 per each of the guide roller units 16, 17 is decreased to two or three, the guide roller units 16, 17 can be made to travel the curved guide rail 2 even when the guide roller units 16, 17 don't swivel to the tracking cart 4. Especially, if the number of the guide rollers 60 per a guide roller unit is reduced to two and a line connecting centers of the two guide rollers 60 is set to go through the center of curvature at the curved guide rail 2, the tracking cart 4 can travel the curved guide rail 2 smoothly. At a moment of traveling through the curved guide rail 2, the pickup coil 18 is out of the litz wires 41, 42, but a time of being out of place is short, therefore it doesn't bring about a problem specially.

In the embodiment, since the guide rail 2 is laid on the grating floor 22, unlike the case where the guide rail 2 is laid in the space 24 under the floor 22, installation is easy and also layout alteration after the installation is simple. Furthermore, since the guide rail 2 can be laid near the load port 28 etc., the guide rail 2 is not likely to be a hindrance to the crew, the pushcart, etc. Although the guide rail 2 is provided with the pair of litz wires 41, 42 and provided with the marks 44, 45, the height and the width of the guide rail 2 including those can be controlled to 1 to 3 cm and 5 to 15 cm, respectively, and hence the tracking cart system can be constructed to be considerably compact. Further, by using the pair of guide roller units 16, 17, the tracking cart 4 is made to be guided by the guide rail 2, and the driving wheel 12 situated almost in the center with respect to the front-rear direction of the cart body 6 at the same time somewhat near the guide rail 2 in the crosswise direction can travel smoothly on the curved guide rail 2 as well as on the straight guide rail 2. Furthermore, the pair of driven wheel 20, 21 provided on the bottom face of the tracking cart 4, being at the opposite side to the guide rail 2, serve to support part of the load from the tracking cart 4.

FIGS. 6 to 9 show another embodiment.

Figure 6:
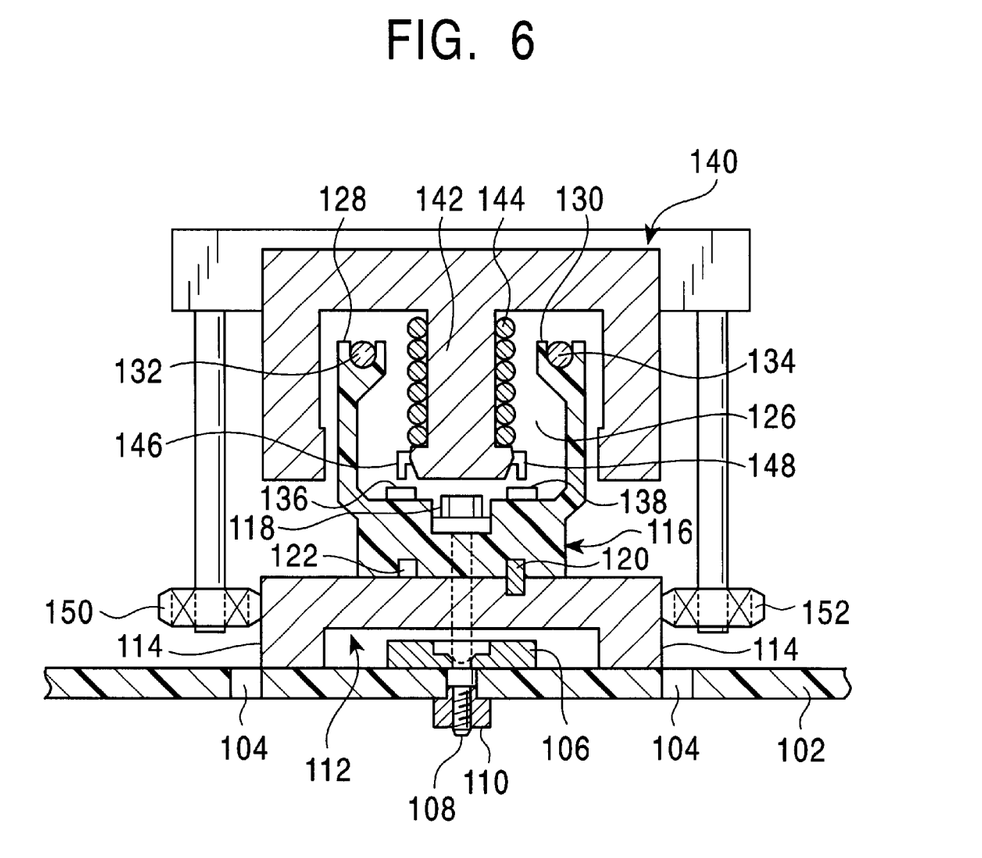
FIG. 6 is a cross section of a guide rail, a power feeding wire holder, and a power feeding part of a tracking cart in a tracking cart system of another embodiment.

FIG. 6 is a view showing that, with the use of openings 104 formed on a grating floor 102 in the clean room etc., a guide rail 112 and a power feeding wire holder 116 are installed thereon. 106 is an attachment plate made of a metal etc. and 108 is a bolt that is inserted into the opening 104. The attachment plate 106 is fixed to the grating floor 102 with a nut 110 or alternatively a nut plate and so on which is not shown in the drawings together with the bolt 108. In the attachment plate 106, formed is a hole 165, which allows the bolt 108 to go through the attachment plate 106, so as to have a diameter sufficiently larger than a diameter of a shaft of the bolt 108. Because of this structure, the attachment position of the attachment plate 106 can be adjusted to the opening 104 by displacing the attachment plate 106 in the front-rear direction and in the crosswise direction to the bolt 108 as a center, so even when using the opening 104, the attachment plate 106 can be fixed to a desired position on the grating floor 102. By the way, preferably, the attachment plate 106 has been fixed beforehand at the time of constructing the grating floor 102. 112 is the guide rail that is manufactured by extruding or the like in a shape of a long object using a material that excels in the wear and abrasion resistance, such as aluminum, nylon, engineering plastics and so on. 114, 114 are guiding sides provided, for example, at the right and the left of the guide rail 112.

116 is the power feeding wire holder made of a synthetic resin that is easy to mold, such as hard vinyl chloride etc., whose bottom face is fixed on an upper face of the guide rail 112. 118 is the bolt which goes through the power feeding wire holder 116 and the guide rail 112 and is fixed by a nut part (not shown in the drawings) formed on the attachment plate 106. Consequently, the bolt 118 serves to fasten both the power feeding wire holder 116 and the guide rail 112 on the attachment plate 106. 120 is a pin that is fabricated to fit in a long slot 122 formed on the bottom of the power feeding wire holder 116 to position the guide rail 112 and the power feeding wire holder 116 so as not to displace in the crosswise direction of FIG. 1. Here, since the guide rail 112 and the power feeding wire holder 116 are both members of a long shape, the positioning of these members in the crosswise direction of FIG. 6 effects positioning of both members to each other because of a plurality of positioning points.

The power feeding wire holder 116 has an almost U-shape in the cross section taken along the direction of the short side, a pair of contiguous grooves 128, 130 are provided on upper parts on the both ends of the U-shape, and litz wires 132, 134 serving as the power feeding wires are housed in the grooves 128, 130. Each of the litz wires 132, 134 is a strand made of a number of thin wires through which a high-frequency current of a frequency of about 1 to 100 kHz is made to flow, and is used to achieve non-contact power feeding. 136, 138 are marks (dogs) provided, for example, on an inner bottom of the U-shape of the power feeding wire holder 116.

140 is a non-contact power feeding part provided in the later-described tracking cart side, having a yoke whose cross section is an E-shape fallen sidelong, which is made of a magnetic material and such that wire is wound around a central protruding piece 142 thereof to form a pickup coil 144. 146, 148 are a pair of sensors that read instructions such as stop positions, speeds, etc. from the marks 136, 138. In addition, the tracking cart side is provided with guide rollers 150, 152 that are guided by right and left guiding faces 114, 114 of the guide rail 112 to set the attitude of the tracking cart.

Figure 7:
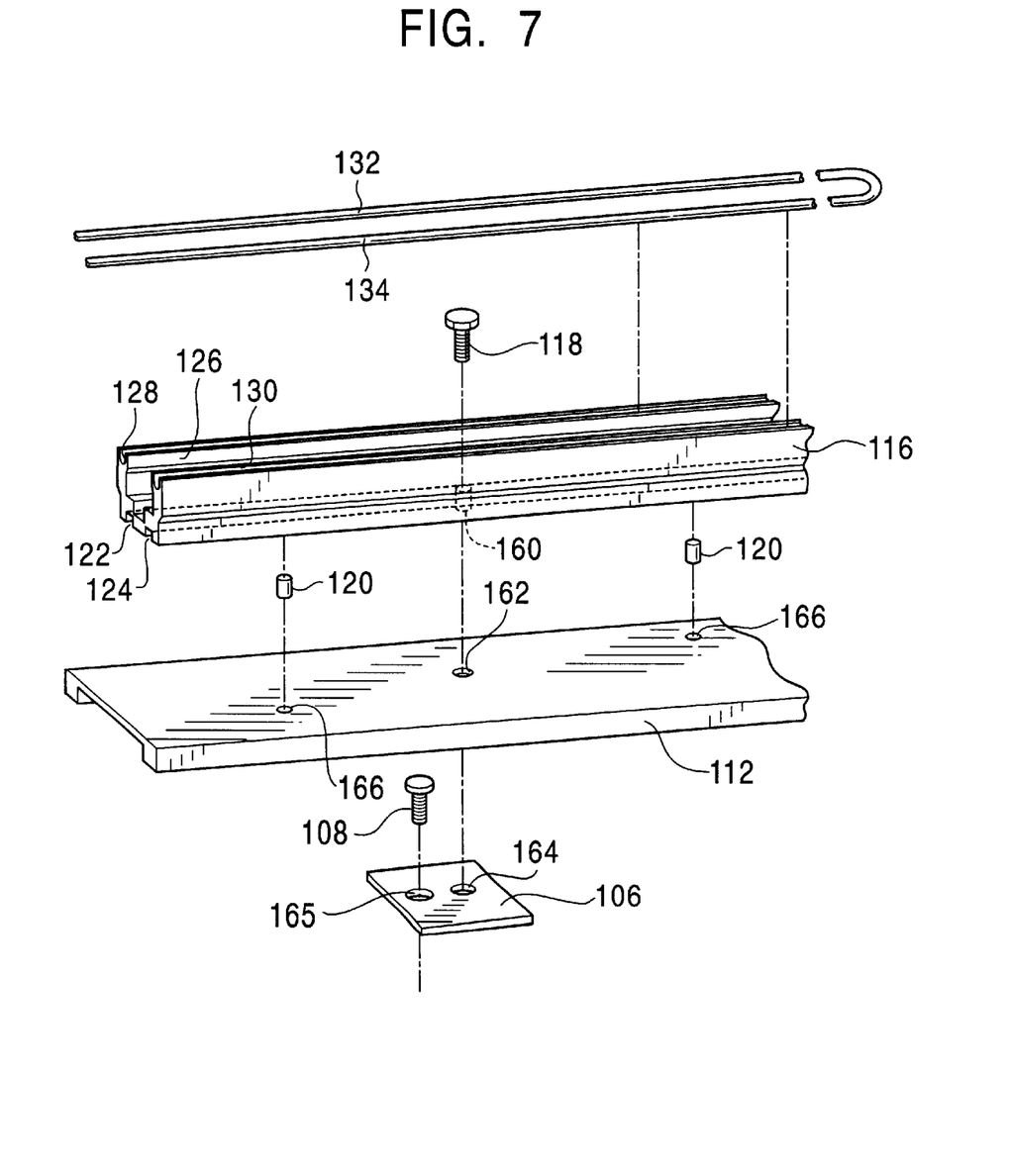
FIG. 7 is a perspective view showing an attachment plate, the guide rail, and the power feeding wire holder all of which are separated from one another to show their assembly in another embodiment.

FIG. 7 is a view showing the construction of the guide rail 112 and the power feeding wire holder 116, wherein first the attachment plate 106 is installed on the grating floor 102 with bolts 108 etc. with the use of the openings 104 thereof. A pair of long slots 122, 124 are provided at an outer bottom of the power feeding wire holder 116, which is positioned to the guide rail 112 regarding crosswise direction by means of the pins 120 etc. 166 is a pin hole formed on the guide rail 112 to fit with the pin 120. A hole 160 is formed in the central part of the bottom of the U-shape of the power feeding wire holder 116, a hole 162 linking to the hole 160 is formed in the central part regarding crosswise direction of the guide rail 112, and a nut part 164 is provided at a corresponding position on the attachment plate 106. Then the power feeding wire holder 116 is positioned by means of the pins 120, the bolt 118 is made to go through the holes 160, 162 and fixed with the nut part 164, so that the power feeding wire holder 116 and the guide rail 112 are fixed to the attachment plate 106 in one body. Then, for example, after this the litz wires 132, 134 are fixed in the contiguous grooves 128, 130.

Figure 8:
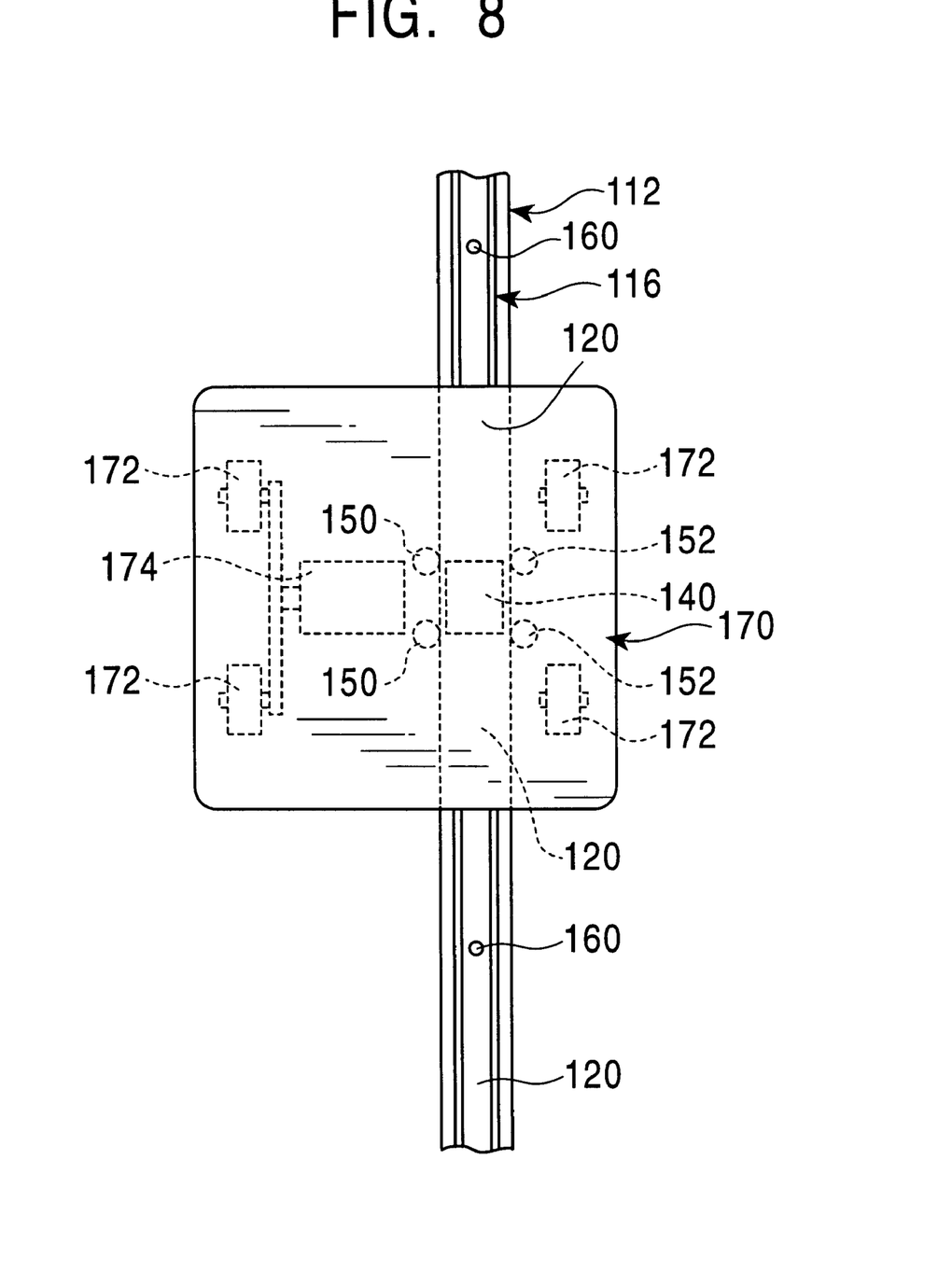
FIG. 8 is a top view showing a traveling system of the tracking cart traveling on the guide rail in another embodiment.
Figure 9:
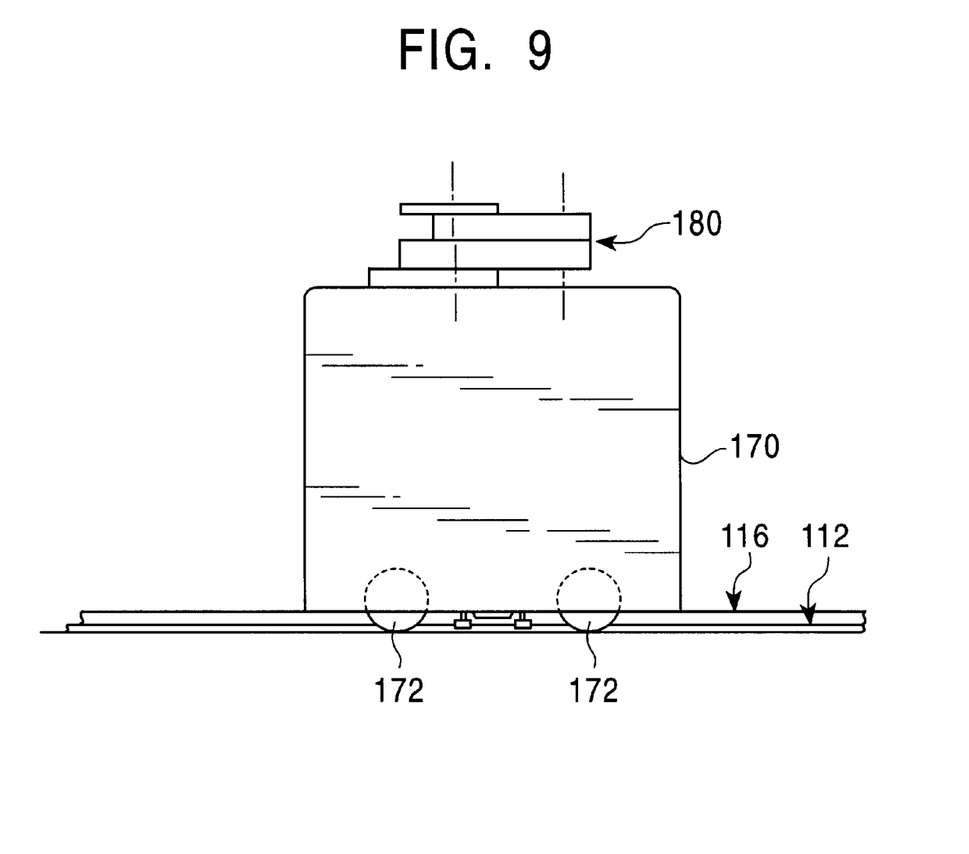
FIG. 9 is a side view of the tracking cart traveling on the guide rail in another embodiment.

FIGS. 8 and 9 are views showing the tracking cart 170 being guided by the guide rail 112. FIG. 8 is a view showing a travel system of the tracking cart 170, where 172 is wheels that drive the tracking cart 170 by force of a driving motor 174. Arrangement of the wheels 172 and the driving mechanism for traveling may be selected arbitrarily. The guide rollers 150, 152 are provided, for example, coming to four, and arranged, for example, in the front and in the rear of the non-contact power feeding part 140. Moreover, the pins 120 are fixed to the guide rail 112. The number of the pins 120 are, for example, two between the holes 160, 160 to which the bolt 118 is fixed. Preferably, the number of the pins 120 for a certain length of the guide rail 112 is about one times to four times the numbers of the bolts 118 for that length. Then, as shown in FIG. 9, the tracking cart 170 is provided with a loading means 180 on the upper part thereof, which loads an article to and from a station etc. in the clean room, and which travels to a next station while being guided by the guide rail 112 and being fed in a non-contact manner.

The embodiment achieves the following effects.

The guide rail 112 that has a simple shape and yet requires dimensional accuracy and the power feeding wire holder of a complicated shape are constructed in separate bodies and of different materials, and both members are positioned by means of the pins 120 and common fastening bolts 118. Since the guide rail 112 and the power feeding wire holder 116 are both long length members, the number of constituents of the system is small, therefore the construction is easy. The guide rail 112 and the power feeding wire holder 116 can be installed with the attachment plate 106 and both members are positioned accurately to each other by means of the pins 120. The pickup coil 144 is housed in the hollow part 126 of the power feeding wire holder 116, and this structure gives a high efficiency of power feeding. Since the tracking cart 170 is positioned to the guide rail 112 by means of the guide rollers 150, 152, the pickup coil 144 is concomitantly positioned to the litz wires 132, 134. Since the litz wires 132, 134 are embedded in the grooves only except for upper parts thereof exposed to the air, there is no risk of being hooked by the crew or something, and hence this construction increases the reliability and gives a good appearance.

What is claimed is:

1. A tracking cart system comprising:
   a guide rail, that is laid on a floor, having a pair of parallel outwardly facing side walls,
   a pair of power feeding wire holders fixed on said guide rail, one disposed at a predetermined distance inwardly from each said side wall,
   power feeding wires, held by said wire holders, for non-contact power feeding; and
   a tracking cart provided with guide rollers that are guided by said side walls of said guide rail and a pickup coil through which electrical power is fed by said power feeding wires.

2. A tracking cart system according to claim 1, wherein said guide rail is provided with marks and said tracking cart is provided with a sensor or sensors for detecting said marks.

3. A tracking cart system according to claim 1, wherein said power feeding wire holder is provided with marks and said tracking cart is provided with a sensor or sensors for detecting said marks.

4. A tracking cart system according to any one of claims 1, 2 or 3, wherein the floor is constructed as a grating floor, attachment members are installed on the floor by passing fastening members through holes of the floor, and further the guide rail is fixed to the attachment members.

5. A tracking cart system comprising:
   a guide rail having a pair of parallel outwardly facing side walls;
   a power feeding wire holder of a contiguous shape that exists along the longitudinal direction of the guide rail as a separate body from the guide rail, and wherein the guide rail and the power feeding wire holder are positioned to each other; and
   a tracking cart comprising guide rollers for bearing on said side walls of said guide rail and a pickup coil;
   wherein a pair of contiguous grooves in parallel to the guide rail are formed on said power feeding wire holder, one contiguous groove disposed at a predetermined distance inwardly from each said side wall, and a pair of power feeding wires are held by said pair of grooves, and the pickup coil of the tracking cart is positioned to said pair of power feeding wires by positioning the guide rollers of the tracking cart by means of said guide rail.

6. A tracking cart system according to claim 5, wherein said contiguous grooves are formed at vicinities of both ends of an almost U-shaped cross section of said power feeding wire holder, the power feeding wires are held in the contiguous grooves, and said pickup coil is positioned in a hollow part of the U-shape.

7. A tracking cart system according to claim 5 or claim 6, wherein said power feeding wire holder and said guide rail are fixed to an attachment member on a floor with common fastening members.

8. A tracking cart system according to claim 7, wherein said attachment member is fixed on a grating by passing fastening members through holes formed on said floor.

* * * * *